United States Patent
Lee et al.

(10) Patent No.: US 7,058,105 B2
(45) Date of Patent: Jun. 6, 2006

(54) SEMICONDUCTOR OPTOELECTRONIC DEVICE

(75) Inventors: Sung-nam Lee, Kyungki-do (KR); Kyoung-ho Ha, Seoul (KR); Tan Sakong, Kyungki-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 357 days.

(21) Appl. No.: 10/624,687

(22) Filed: Jul. 23, 2003

(65) Prior Publication Data

US 2004/0125839 A1     Jul. 1, 2004

(30) Foreign Application Priority Data

Oct. 17, 2002  (KR) .................... 10-2002-0063539
May 27, 2003  (KR) .................... 10-2003-0033842

(51) Int. Cl.
*H01S 5/00* (2006.01)
(52) U.S. Cl. .................. 372/45.01; 372/46.01
(58) Field of Classification Search ............ 372/45.01, 372/75, 43, 50
See application file for complete search history.

(56) References Cited

U.S. PATENT DOCUMENTS

| | | | | |
|---|---|---|---|---|
| 5,298,762 A | * | 3/1994 | Ou | ................ 257/13 |
| 5,583,878 A | * | 12/1996 | Shimizu et al. | .......... 372/45.01 |
| 5,889,805 A | * | 3/1999 | Botez et al. | ............. 372/45.01 |
| 6,744,064 B1 | * | 6/2004 | Lee et al. | ...................... 257/13 |

FOREIGN PATENT DOCUMENTS

| | | |
|---|---|---|
| CN | 1347178 A | 5/2002 |
| GB | 2 346 735 A | 8/2000 |
| JP | 2000-340892 A | 12/2000 |

* cited by examiner

*Primary Examiner*—Minsun Oh Harvey
*Assistant Examiner*—Tuan Nguyen
(74) *Attorney, Agent, or Firm*—Buchanan Ingersoll PC

(57) ABSTRACT

A highly efficient semiconductor optoelectronic device is provided. The semiconductor optoelectronic device includes an active layer, an upper waveguide layer provided on the active layer and a lower waveguide layer provided under the active layer, an upper cladding layer provided on the upper waveguide layer and a lower cladding layer provided under the lower waveguide layer, a substrate supporting a deposited structure of the lower cladding layer, the lower waveguide layer, the active layer, the upper waveguide layer, and the upper cladding layer, and upper and lower optical confinement layers provided between the active layer and the upper waveguide layer and between the active layer and the lower waveguide layer, respectively, and having an energy gap that is smaller than those of the upper and lower waveguide layers but greater than that of the active layer.

24 Claims, 7 Drawing Sheets

SEMICONDUCTOR OPTOELECTRONIC DEVICE

BACKGROUND OF THE INVENTION

This application claims the priority of Korean Patent Application Nos. 2002-63539 and 2003-33842, filed on Oct. 17, 2002 and May 27, 2003, respectively, in the Korean Intellectual Property Office, the disclosure of which is incorporated herein in its entirety by reference.

1. Field of the Invention

The present invention relates to a semiconductor optoelectronic device, and more particularly, to a semiconductor optoelectronic device having a high optical efficiency.

2. Description of the Related Art

Figure 1:
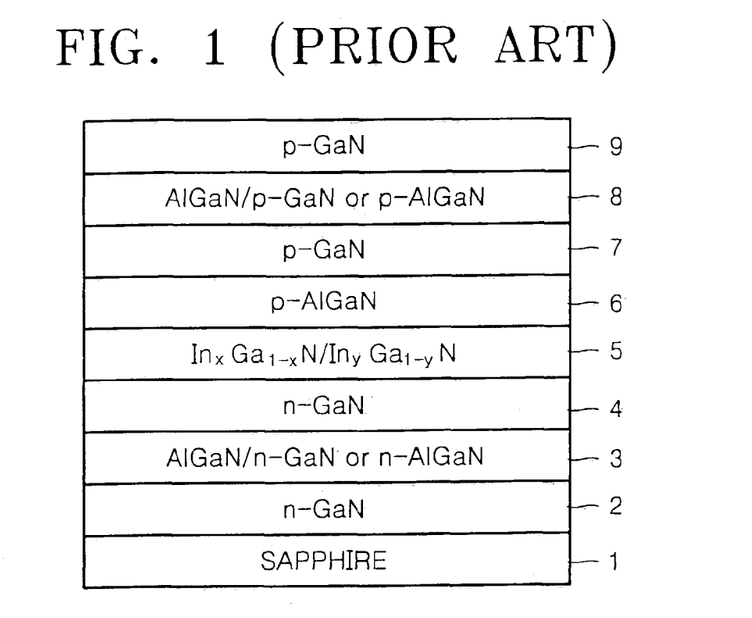
FIG. 1 is a cross-sectional view of a conventional nitride-based semiconductor laser device.

As shown in FIG. 1, a semiconductor laser device, which is one kind of nitride-based semiconductor optoelectronic device, has a sapphire substrate 1 as its base and includes an active layer 5 emitting or receiving light, n-type layers 2, 3, and 4 deposited on the sapphire substrate 1, and p-type layers 6, 7, and 8 deposited on the n-type layers 2, 3, and 4.

In particular, the p-type layer 7 and the n-type layer respectively provided on and under the active layer 5 are a p-type waveguide layer and an n-type waveguide layer, respectively. In order to confine electrons, holes, and light, the p-type cladding layer 8 and the n-type cladding layer 3 are provided on the p-type waveguide layer 7 and under the n-type waveguide layer 4, respectively. The electron blocking layer 6 through which only holes can pass is provided between the p-type waveguide layer 7 and the active layer 5. The n-type GaN contact layer 2 is provided between the sapphire substrate 1 and the n-type cladding layer 3, and a p-type GaN layer is provided on the p-type cladding layer 8.

Such a nitride-based emitting device uses a sapphire substrate. In general, in a nitride-based laser diode, a waveguide layer for guiding light emitted from an active layer is formed of GaN, and a cladding layer confining electrons and light therein is formed of $Al_xGa_{1-x}N$.

$Al_xGa_{1-x}N$ has a greater energy gap than GaN. In addition, a difference in refractory indexes between $Al_xGa_{1-x}N$ and InGaN, which forms an active layer, is greater than a difference in refractory indexes between GaN and InGaN.

$Al_xGa_{1-x}N$ has smaller lattice constant and thermal expansion coefficient than GaN used as a material of an n-type contact layer, which may cause cracks in a nitride-based laser diode. Accordingly, there have been limits put on the composition ratio and thickness of aluminum in a cladding layer formed of $Al_xGa_{1-x}N$. According to various research results, those limits are as follows. A supper lattice formed of AlGaN/GaN has an aluminum composition ratio of about 14% and an aluminum thickness of 1 μm. Bulk AlGaN layer has an aluminum composition ratio of about 8% and an aluminum thickness of 1 μm. Due to those limits put on the composition ratio and thickness of aluminum in a cladding layer formed of $Al_xGa_{1-x}N$, mode leakage toward a substrate, i.e., an optical confinement factor, decreases.

Mode leakage reduces an optical confinement factor, and thus an optical gain decreases. Therefore, the leakage mode increases the amount of current necessary to start oscillating a laser device and has a bad influence on a far-field pattern of the laser device. A decrease in the optical confinement factor also increases the amount of current necessary to start oscillating the laser device, decreases an internal quantum efficiency, and also has a bad influence on the far-field pattern of the laser device.

SUMMARY OF THE INVENTION

The present invention provides a semiconductor light emitting device having improved durability and reliability by effectively increasing an optical confinement factor.

The present invention also provides a highly efficient semiconductor light emitting device capable of decreasing the level of current necessary to oscillate a laser by taking advantage of an optical gain and thus lowering an operation input power.

According to an aspect of the present invention, there is provided a semiconductor optoelectronic device. The semiconductor optoelectronic device includes an active layer, an upper waveguide layer provided on the active layer and a lower waveguide layer provided under the active layer, an upper cladding layer provided on the upper waveguide layer and a lower cladding layer provided under the lower waveguide layer, a substrate supporting a deposited structure of the lower cladding layer, the lower waveguide layer, the active layer, the upper waveguide layer, and the upper cladding layer, and upper and lower optical confinement layers provided between the active layer and the upper waveguide layer and between the active layer and the lower waveguide layer, respectively, and having an energy gap that is smaller than those of the upper and lower waveguide layers but greater than that of the active layer.

Preferably, an electron blocking layer is interposed between the upper waveguide layer and the upper optical confinement layer.

Preferably, the substrate is formed of Si, sapphire, SiC, or GaN.

Preferably, the active layer, the upper and lower waveguide layers, the upper and lower cladding layers, and the upper and lower optical confinement layers are formed of a nitride-based material.

Preferably, the upper and lower waveguide layers are formed of p-GaN and n-GaN, respectively. Preferably, the upper cladding layer is formed of p-AlGaN/p-GaN, p-AlGaN/GaN, AlGaN/p-GaN, or p-AlGaN, and the lower cladding layer is formed of n-AlGaN/n-GaN, n-AlGaN/GaN, AlGaN/n-GaN, or n-AlGaN.

Preferably, a p-GaN contact layer is formed on the upper cladding layer, and an n-GaN contact layer is formed under the lower cladding layer. Preferably, the active layer is formed as a multiple or single quantum well structure composed of $Al_vIn_xGa_{1-x-v}N/Al_wIn_yGa_{1-y-w}N$ ($0 \leq v, w, x, y \leq 1$, $0 \leq x+y$, $y+w \leq 1$, $y \leq x$, $v \leq w$). In other words, the active layer may be formed of GaN, AlGaN, InGaN, or AlInGaN.

Preferably, the optical confinement layer is formed of $In_zGa_{1-z}N$.

Preferably, the optical confinement layer is doped with Si or Mg.

Preferably, the optical confinement layer has a thickness of more than 100 Å.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

In order to increase an optical gain by increasing an optical confinement factor in a cladding layer having a maximum allowable aluminum composition ratio that does not cause any cracks, the present invention provides a semiconductor light emitting device having a light emitting device where an $Al_xIn_yGa_{1-x-y}N$ ($0 \leq x$, $y \leq 1$, $0 \leq x+y \leq 1$) optical confinement layer is interpolated between an active layer and an upper waveguide layer on the active layer and between the active layer and a lower waveguide layer under the active layer.

The semiconductor light emitting device according to the present invention has an enhanced internal quantum efficiency, and a reduced laser oscillation starting current and a reduced operation input power. The decrease in laser oscillation starting current and operation input power contributes to an extending life span of the semiconductor light-emitting device.

The semiconductor light-emitting device according to the present invention can be applied to a III–V optoelectronic device and a nitride-based optoelectronic device, such as a nitride-based light emitting device or a nitride-based light receiving device.

Figure 2:
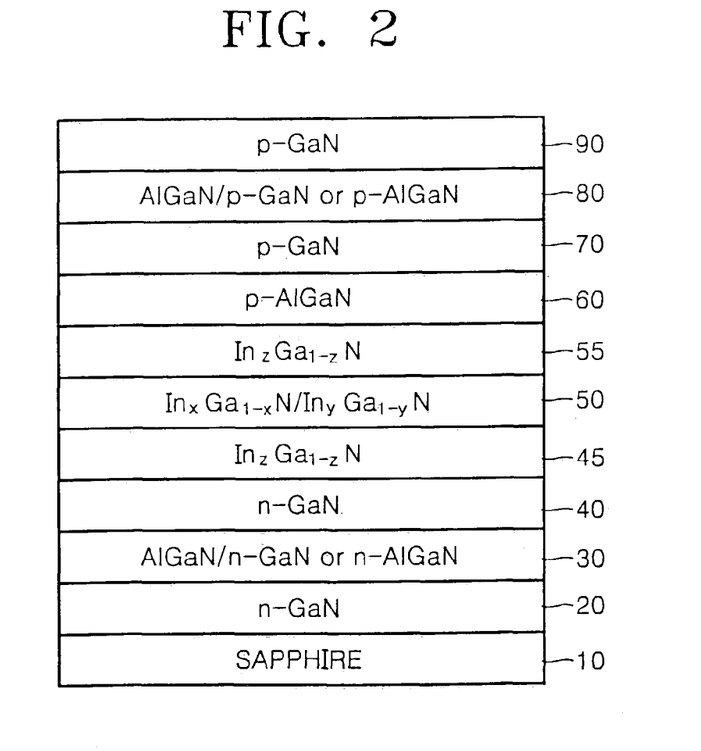
FIG. 2 is a cross-sectional view of a semiconductor laser device according to a preferred embodiment of the present invention.
Figure 3:
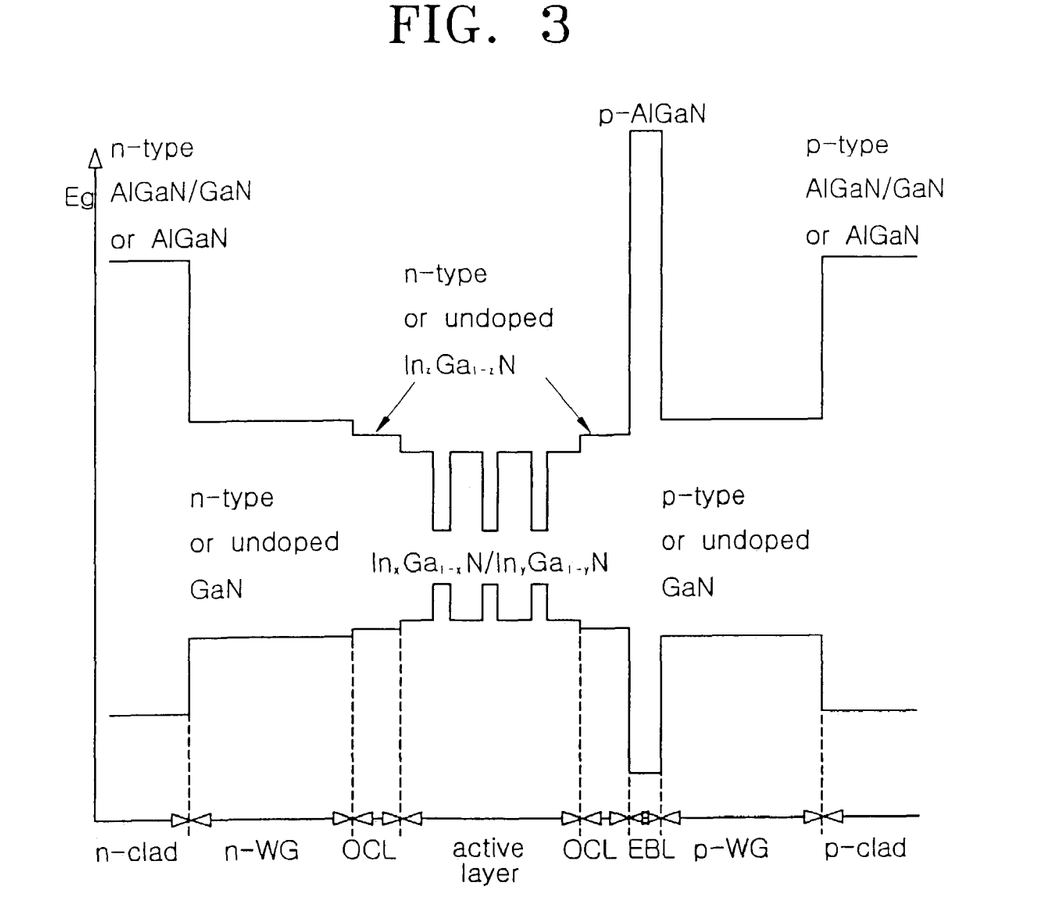
FIG. 3 is a graph showing an energy gap of each layer constituting the semiconductor laser device shown in FIG. 2.

FIG. 2 is a cross-sectional view of an optoelectronic device, for example, a semiconductor laser device according to a preferred embodiment of the present invention, and FIG. 3 is a graph showing an energy gap of each layer constituting the semiconductor laser device shown in FIG. 2.

Referring to FIG. 2, a GaN contact layer 20 doped with Si is formed on a substrate 10 formed of Si, SiC, GaN, or sapphire. An electronic light emitting layer having an InGaN active layer 50 as its main element is provided on the GaN contact layer 20. The InGaN active layer 50 has a single or multiple quantum well structure composed of $Al_vIn_xGa_{1-x-v}N$ and $Al_wIn_yGa_{1-y-w}N$ ($0 \leq v$, w, x, $y \leq 1$, $0 \leq x+y$, $y+w \leq 1$, $y \leq x$, $v \leq w$). Here, $Al_vIn_xGa_{1-x-v}N$ and $Al_wIn_yGa_{1-y-w}N$ have different energy gaps. In other words, the InGaN active layer 50 may be formed of GaN, AlGaN, InGaN, or AlInGaN.

An n-type optical confinement layer 45 and a p-type optical confinement layer 55 are respectively formed under and on the InGaN active layer 50. The lower optical confinement layer 45 may be formed of $Al_xIn_yGa_{1-x-y}N$ ($0 \leq x$, $y \leq 1$, $0 \leq x+y \leq 1$). For example, the lower optical confinement layer 45 may be formed of n-type or non-doped $Al_xIn_yGa_{1-x-y}N$, $Al_xGa_{1-x}N$, or $In_yGa_{1-y}N$, and the upper optical confinement layer 55 may be formed of (p–)-type, (n–)-type, or non-doped $Al_xIn_yGa_{1-x-y}N$, $Al_xGa_{1-x}N$, or $In_yGa_{1-y}N$. The energy gap of the optical confinement layers 45 and 55 is greater than or the same as that of the InGaN active layer 50 but smaller than or the same as that of lower and upper waveguide layers 40 and 70, which will be described in the following paragraph.

As shown in FIG. 2, the lower and upper waveguide layers 40 and 70 are formed of n-type GaN and p-type GaN, respectively. The lower and upper waveguide layers 40 and 70 have a greater energy gap than that of the optical confinement layers 45 and 55. An n-AlGaN/n-GaN, n-AlGaN/GaN, AlGaN/n-GaN or n-AlGaN cladding layer 30 and an n-GaN contact layer 20 are formed under the lower waveguide layer 40.

A p-type AlGaN electron blocking layer 60 is interposed between the upper optical confinement layer 55 and the upper waveguide layer 70. As shown in FIG. 3, the p-type AlGaN electron blocking layer 60 has the greatest energy gap so that electrons can be prevented from passing through the p-type AlGaN electron blocking layer 60 and only holes are allowed to pass through the p-type AlGaN electron blocking layer 60.

A p-AlGaN/p-GaN, p-AlGaN/GaN, AlGaN/p-GaN or p-AlGaN cladding layer 80 and a p-GaN upper contact layer 90 are formed on the upper waveguide layer 70.

According to the present invention, due to the optical confinement layers 45 and 55 respectively provided under and on the active layer 50, it is possible to increase an optical confinement factor even though there have been limits put on the composition ratio and thickness of aluminium in an AlGaN cladding layer. Accordingly, it is possible to decrease the level of current necessary for oscillation of a laser device and to enhance an internal quantum efficiency.

In addition, according to the present invention, optical confinement layers having a narrower energy gap than waveguide layers, which have been widely used in optoelectronic devices, are provided to a semiconductor laser device along with the waveguide layers, and thus the optical confinement layers and the waveguide layers can serve the active layer 50 as double optical confinement layers.

Figure 4A:
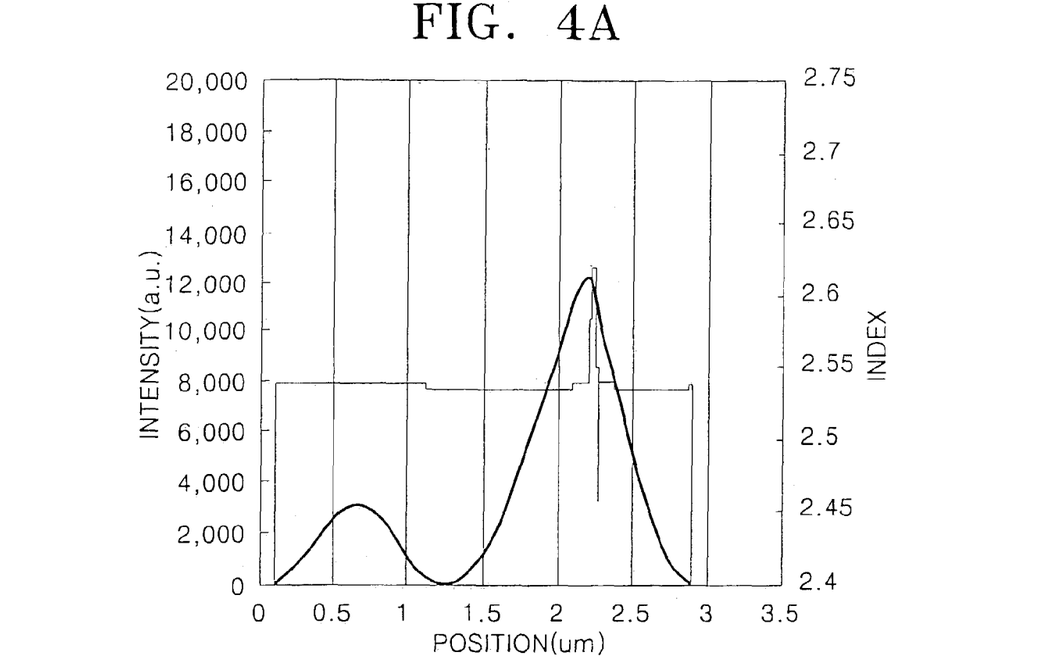
FIGS. 4A and 4B are graphs showing the results of simulations for the variations of an optical confinement factor with respect to different mode profiles of n-type cladding layers having different aluminium composition ratios of 10 and 15%, respectively.
Figure 4B:
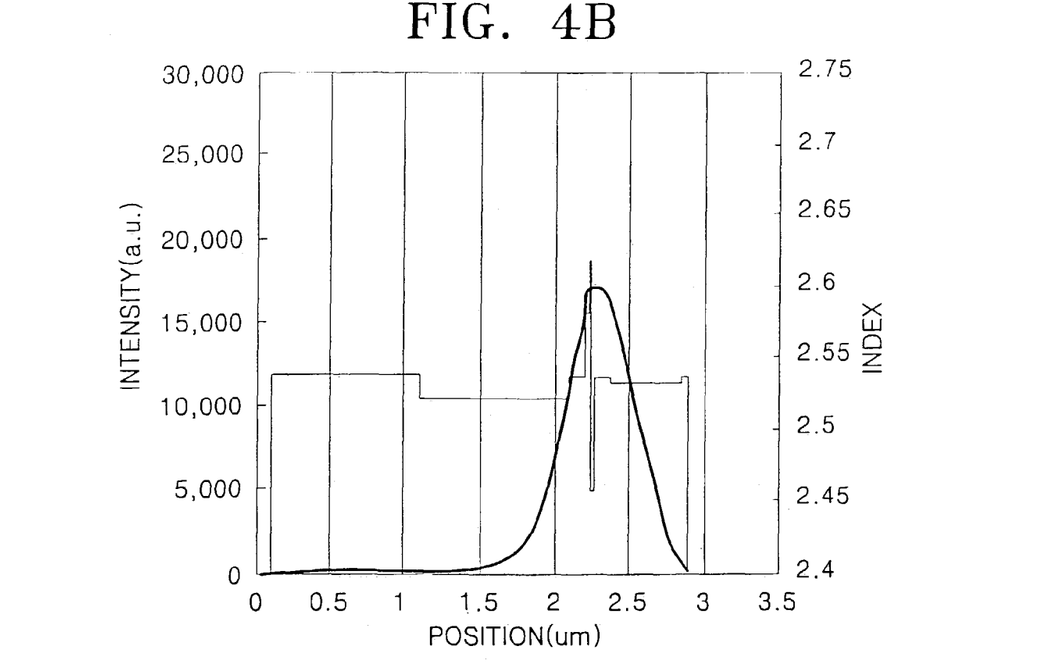

FIGS. 4A through 4D are graphs each showing the results of simulations for the variation of an optical confinement factor with respect to the mode profile of a light emitting device including the n-type cladding layer 30. In particular, FIG. 4A shows the variation of an optical confinement factor with respect to the mode profile of a light emitting device including a p-type cladding layer and an n-type cladding layer, and the p-type and n-type cladding layers have an aluminium composition ratio of 10%, and FIG. 4B shows the variation of an optical confinement factor with respect to the mode profile of a light emitting device including a p-type cladding layer and an n-type cladding layer, and the p-type and n-type cladding layers have an aluminium composition ratio of 10% and an aluminium composition ratio of 15%, respectively.

As shown in FIG. 4A, when an n-type cladding layer has an aluminium composition ratio of 10%, mode leakage around the substrate occurs. On the other hand, as shown in FIG. 4B, when the n-type cladding layer has an aluminium composition ratio of 15%, leakage in the direction toward a substrate does not occur, and an optical confinement factor increases.

Figure 4C:
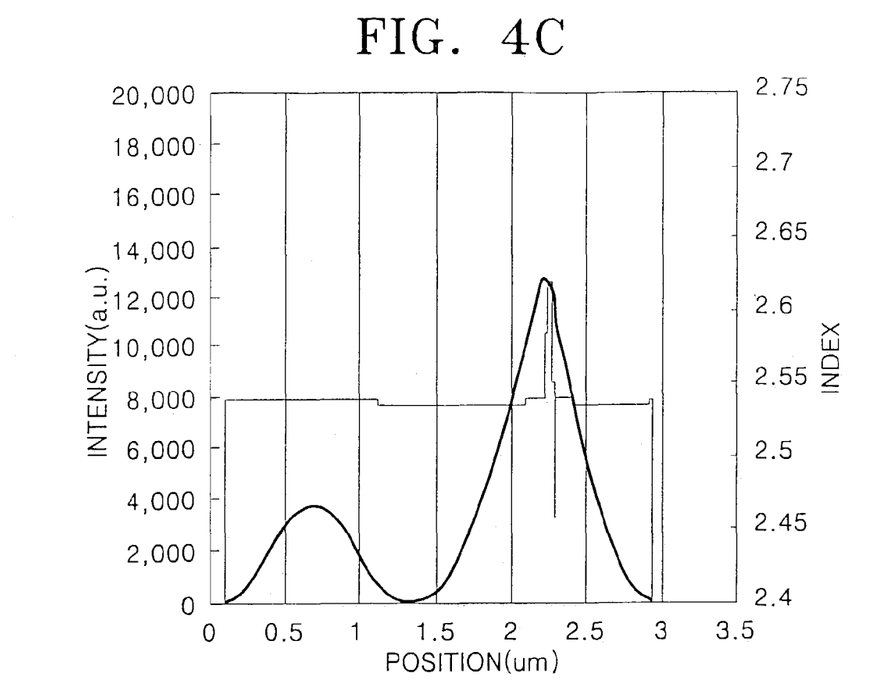
FIGS. 4C and 4D are graphs showing the results of simulations for the variation of mode profile after adding the optical confinement layer of 14 nm to FIGS. 4A and 4B, respectively.
Figure 4D:
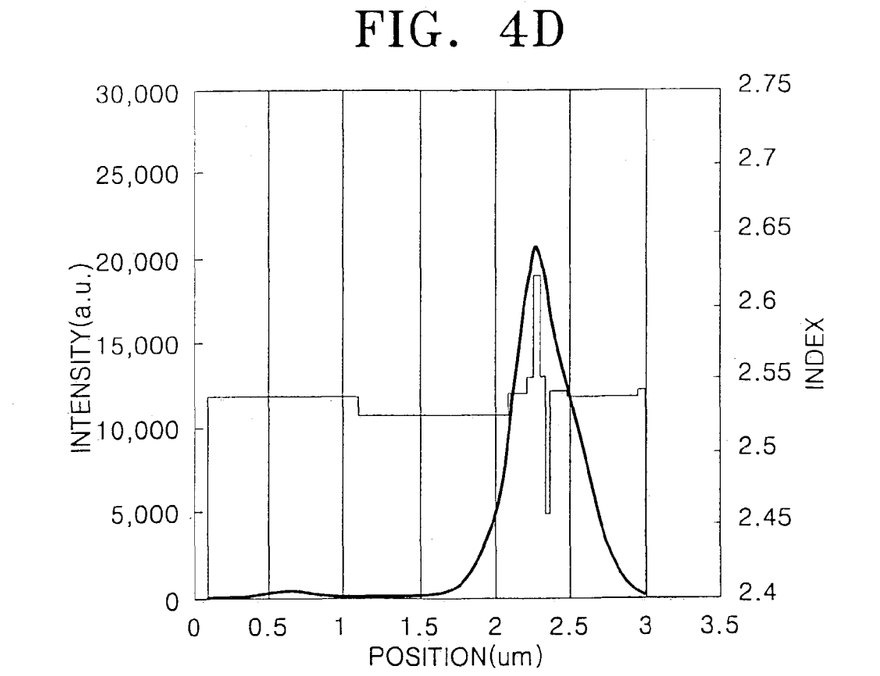

FIG. 4C shows the variation of an optical confinement factor with respect to the mode profile of a light emitting device including an n-type cladding layer having an aluminium composition ratio of 10%, a p-type cladding layer having an aluminium composition ratio of 10%, and an active layer interposed between optical confinement layers formed of $In_zGa_{1-z}N$ to have a thickness of 140 Å. FIG. 4D shows the variation of an optical confinement factor with respect to the mode file of a light emitting device including an n-type cladding layer having an aluminium composition ratio of 15%, a p-cladding layer having an aluminium composition ratio of 10%, and an active layer interposed between optical confinement layers formed of $In_zGa_{1-z}N$ to have a thickness of 140 Å.

FIGS. 4C and 4D show that it is possible to increase an optical confinement factor by providing an optical confinement layer. Even though FIG. 4C shows mode leakage near the substrate, it also shows a decrease in half amplitude compared to FIG. 4A, and the decreasing half amplitude indicates more effective optical confinement. As compared to FIG. 4C, FIG. 4D shows mode leakage around the substrate but a bigger loss in half amplitude obtained by increasing the aluminium composition ratio of the n-type cladding layer used in FIG. 4 from 10% to 15%. Accordingly, FIG. 4D also indicates that it is possible to increase an optical confinement factor by providing an optical confinement layer.

Figure 5A:
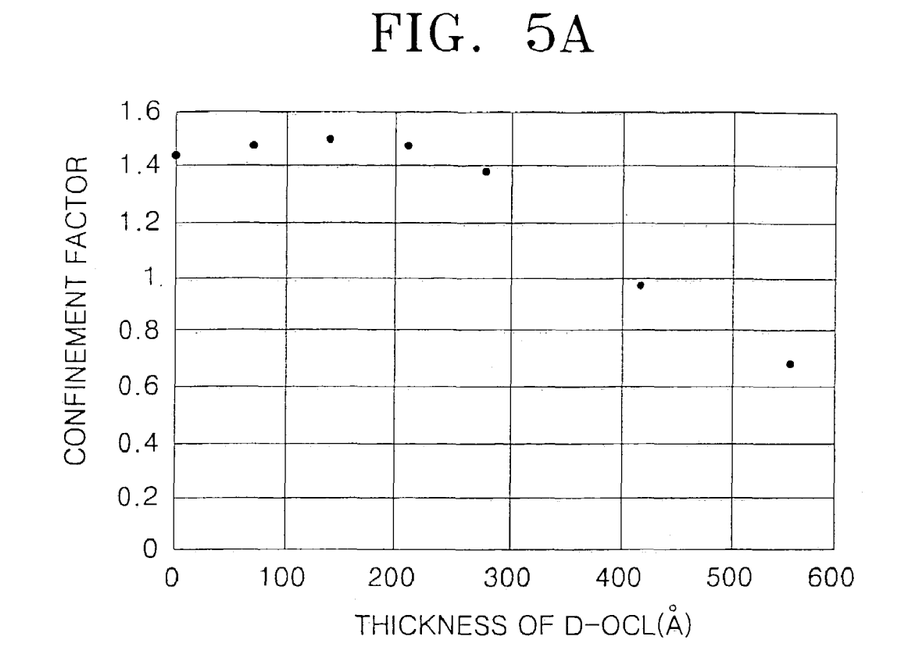
FIGS. 5A through 5C are graphs showing the results of simulations for the variation of an optical confinement factor with respect to the aluminum composition ratio (10%, 13.5%, 15%) of an n-type cladding layer and the thickness of an optical confinement layer.
Figure 5B:
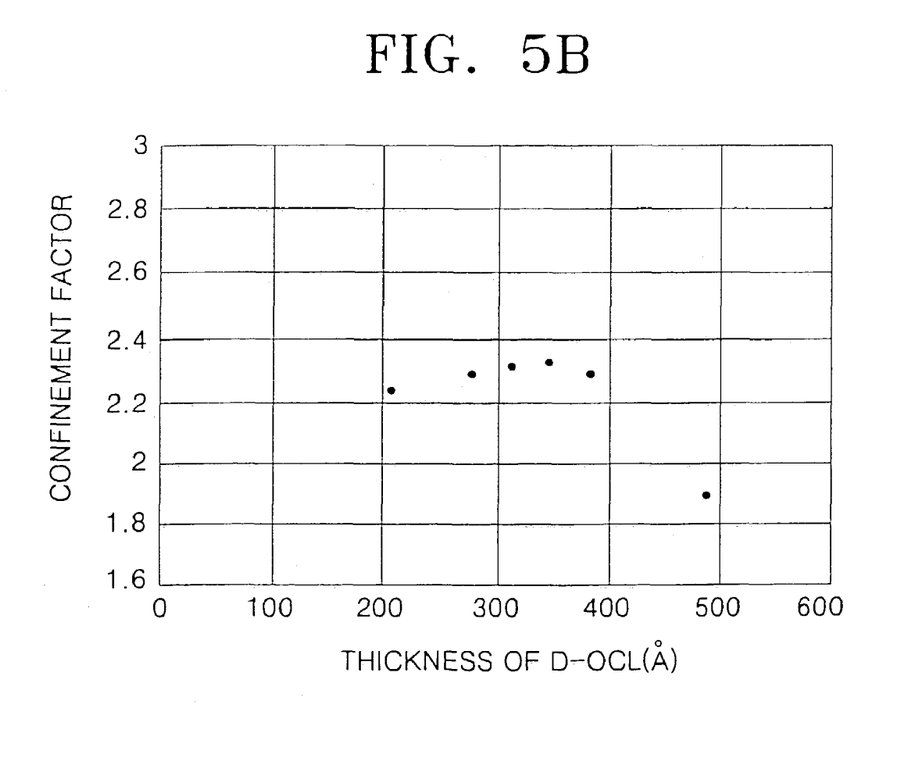
Figure 5C:
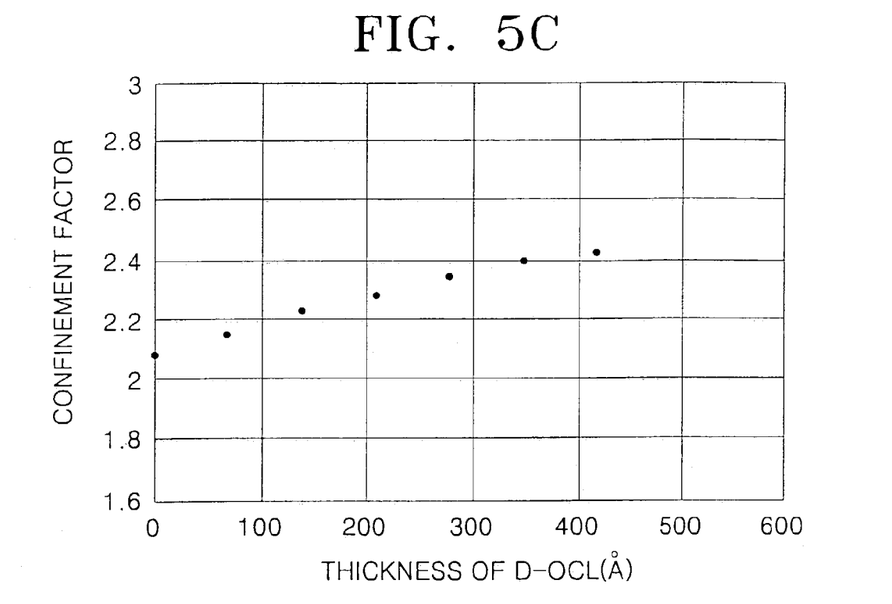

FIGS. 5A through 5C are graphs each showing the results of a simulation for the variation of an optical confinement factor with respect to the thickness of an optical confinement layer. N-type cladding layers used in FIGS. 5A through 5C have different aluminium composition ratios, i.e., 10%, 13.5%, and 15%, respectively.

FIGS. 5A through 5C show that a maximum confinement factor is obtained when an n-cladding layer has an aluminium composition ratio of 10% and an optical confinement layer formed of $In_zGa_{1-z}N$ has a thickness of 140 Å, when the n-type cladding layer has an aluminium composition ratio of 13.5% and the optical confinement layer has a thickness of 350 Å, or when the n-type cladding layer has an aluminium composition ratio of 15% and the optical confinement layer has a thickness of 420 Å.

In particular, in FIG. 5A, a maximum optical confinement factor having a value of about 1.5 is obtained when both an n-type cladding layer and a p-type cladding layer have an aluminium composition ratio of 10% and an optical confinement layer has a thickness of about 140 Å.

In FIG. 5B, a maximum optical confinement factor having a value of about 2.3 is obtained when an n-type cladding layer and a p-type cladding layer have an aluminium composition ratio of 13.5% and an aluminium composition ratio of 10%, respectively, and an optical confinement layer has a thickness of about 350 Å.

In FIG. 5C, a maximum optical confinement factor having a value of about 2.4 or greater is obtained when an n-type cladding layer and a p-type cladding layer have an aluminium composition ratio of 15% and an aluminium composition ratio of 10% and an optical confinement layer has a thickness of about 420 Å.

Figure 5D:
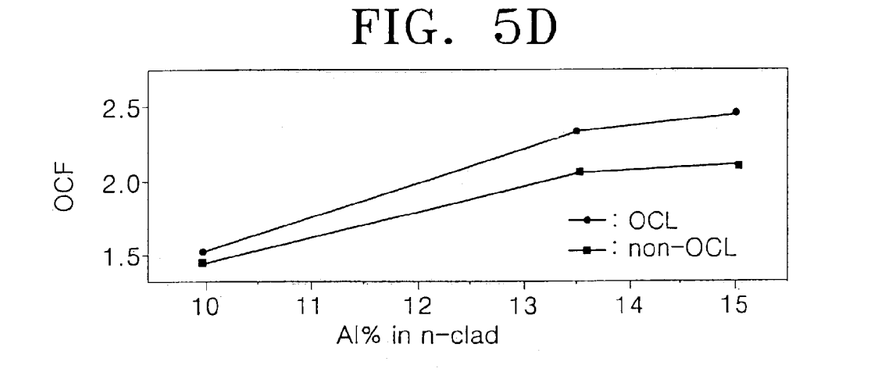
FIG. 5D is a graph showing the variation of an optical confinement factor with respect to the aluminum composition ratio (10%, 13.5%, 15%) of an n-type cladding layer in a light emitting device including an optical confinement layer (solid circle) and the variation of an optical confinement factor with respect to the aluminum composition ratio of an n-type cladding layer in a light emitting device having no optical confinement layer (solid square)

FIG. 5D shows the variation of an optical confinement factor with respect to the aluminium composition ratio (10%, 13.5%, 15%) of an n-type cladding layer in a light emitting device including an optical confinement layer (OCL, solid circle) and the variation of an optical confinement factor with respect to the aluminium composition ratio of an n-type cladding layer in another light emitting device having no optical confinement layer (non-OCL, solid square). As shown in FIG. 5D, an optical confinement factor is greater in the case of providing an optical confinement layer than in the case of not providing any optical confinement layer. In addition, when the aluminium composition ratio of an n-type cladding layer gradually increases, the optical confinement factor in the case of providing an optical confinement layer shows a higher increase rate than its counterpart in the case of not providing any optical confinement layer.

Figure 5E:
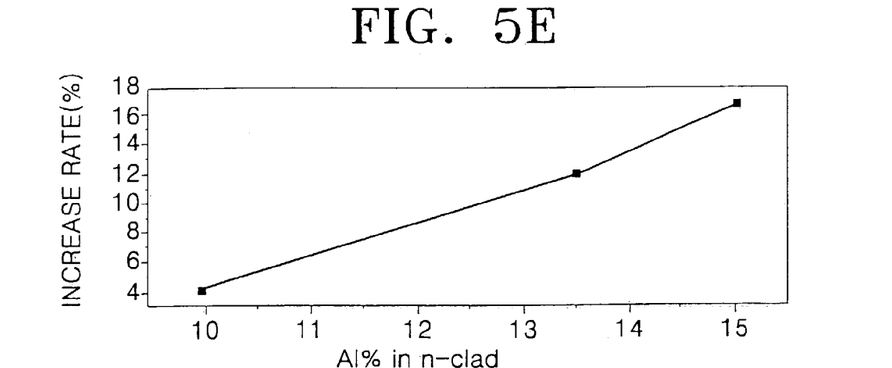
FIG. 5E is a graph showing the variation of an optical confinement factor increase rate with respect to the aluminum composition ratio of an n-type cladding layer in a light emitting device where an optical confinement layer has a predetermined thickness so that a maximum optical confinement factor can be obtained under the same conditions as in FIG. 5D.

FIG. 5E shows the variation of an optical confinement factor increase rate with respect to the aluminium composition ratio of an n-type cladding layer in the case of providing the optical confinement layer.

As shown in FIGS. 5A through 5E, as the aluminium composition ratio of an n-type cladding layer increases, an optical confinement factor increases, and an optimum thickness of an optical confinement layer increases. In the case of the light emitting device according to the present invention, it is possible to increase an optical confinement factor by up to 16% without increasing the aluminium composition ratio of an n-type cladding layer.

Based on the simulation results shown in FIGS. 5A through 5E, it is possible to conclude that an optical confinement layer preferably has a thickness of more than 100 Å, preferably 100–500 Å.

Figure 6:
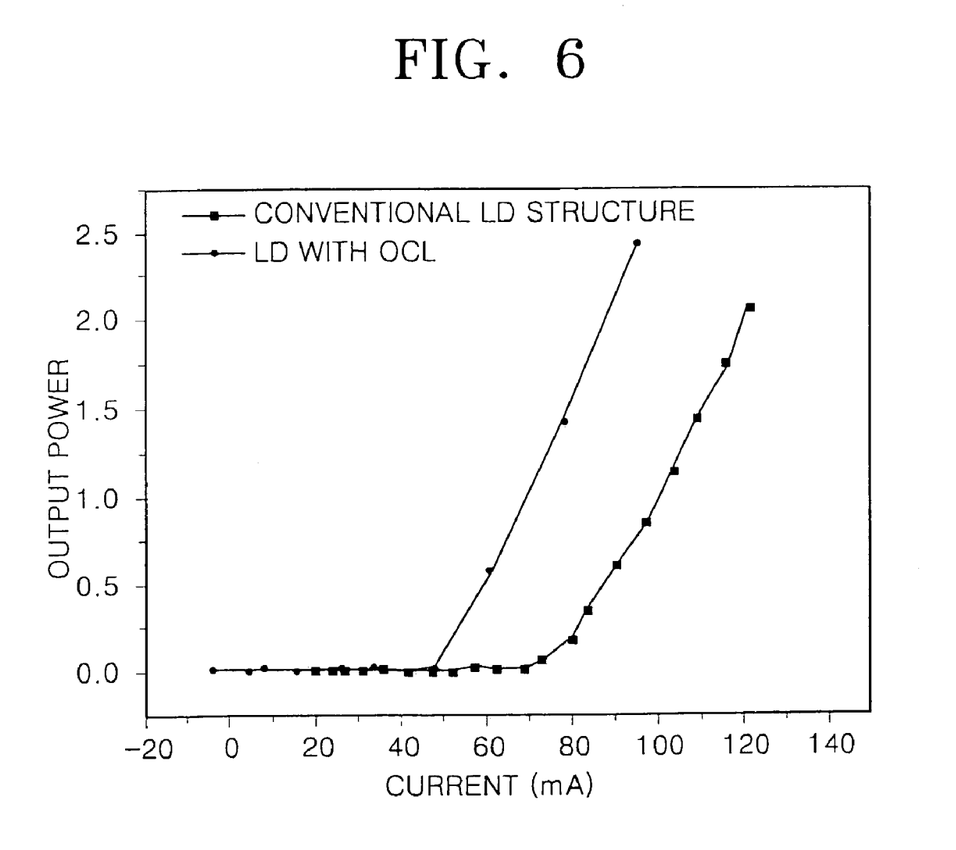
FIG. 6 is a graph showing the variation of the amount of current necessary to start oscillating a laser diode including an optical confinement layer according to the present invention and the variation of the amount of current necessary to start oscillating a conventional laser diode not including an optical confinement layer.

FIG. 6 is a graph showing the variation of the amount of current necessary to start oscillating a laser in a laser diode including an optical confinement layer formed of $In_zGa_{1-z}N$ and the variation of the amount of current necessary to start oscillating a 10 laser in a conventional laser diode having no optical confinement layer. Here, both of the two laser diodes include a non-cracked n-cladding layer having an aluminium composition ratio of 14%. As shown in FIG. 6, the laser diode including the optical confinement layer formed of $In_zGa_{1-z}N$ shows a 40% drop in the amount of current (72 mA) necessary to start oscillating a laser compared to the conventional laser diode (46 mA). The presence of the optical confinement layer in the laser diode leads to the increase in an optical confinement factor, and accordingly, an optical confinement coefficient and an optical gain also increase. Since the optical confinement layer serves as a buffer layer between the n-type cladding layer and an active layer, the amount of current necessary to start oscillating a laser supposedly decreases.

The semiconductor light emitting device according to the present invention provides the following advantages.

Firstly, it is possible to reduce or prevent mode leakage and increase an optical confinement factor by up to 16% without increasing the aluminium composition ratio of an n-type cladding layer.

Secondly, it is possible to effectively decrease stress generated due to a difference in lattice constants between an AlGaN electron blocking layer and an active layer.

Thirdly, it is possible to reduce threshold current of a laser device by up to 40%.

Fourthly, it is possible to reduce the operation current and voltage of a device.

Finally, it is possible to extend the life span of a device by reducing operation input power.

The present invention can be applied to a III–V/nitride-based light emitting or light receiving device. In other words, the present invention can be applied to various devices, including a white light laser emitting diode (LED), a blue LED, a green LED, a violet laser diode (LD), a blue LD, a green LD, and a light receiving device, and an electronic device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor optoelectronic device comprising:
   an active layer;
   an upper waveguide layer provided on the active layer and a lower waveguide layer provided under the active layer;
   an upper cladding layer provided on the upper waveguide layer and a lower cladding layer provided under the lower waveguide layer;
   a substrate supporting a deposited structure of the lower cladding layer, the lower waveguide layer, the active layer, the upper waveguide layer, and the upper cladding layer; and
   upper and lower optical confinement layers provided between the active layer and the upper waveguide layer and between the active layer and the lower waveguide layer, respectively, and having an energy gap that is smaller than those of the upper and lower waveguide layers but greater than that of the active layer.

2. The semiconductor optoelectronic device of claim 1, wherein an electron blocking layer is interposed between the upper waveguide layer and the upper optical confinement layer.

3. The semiconductor optoelectronic device of claim 2, wherein the active layer, the upper and lower waveguide layers, the upper and lower cladding layers, and the upper and lower optical confinement layers are formed of a nitride-based material.

4. The semiconductor optoelectronic device of claim 3, wherein an electron blocking layer formed of p-type AlGaN is interposed between the upper waveguide layer and the upper optical confinement layer.

5. The semiconductor optoelectronic device of claim 4, wherein the optical confinement layer is formed of $Al_xIn_yGa_{1-x-y}N$ ($0 \leq x, y \leq 1, 0 \leq x+y \leq 1$).

6. The semiconductor optoelectronic device of claim 2, wherein the upper and lower waveguide layers are formed of p-GaN and n-GaN, respectively, the upper and lower cladding layers are formed of p-AlGaN/p-GaN and n-AlGaN/n-GaN, respectively, or p-AlGaN and n-AlGaN, respectively, and the active layer is formed of AlInGaN ($Al_vIn_xGa_{1-x-v}N/Al_wIn_yGa_{1-y-w}N$, $0 \leq v, w, x, y \leq 1, 0 \leq x+y, y+w \leq 1, y \leq x, v \leq w$).

7. The semiconductor optoelectronic device of claim 6, wherein the optical confinement layer is formed of $Al_xIn_yGa_{1-x-y}N$ ($0 \leq x, y \leq 1, 0 \leq x+y \leq 1$).

8. The semiconductor optoelectronic device of claim 7, wherein the optical confinement layer is doped with Si or Mg.

9. The semiconductor optoelectronic device of claim 7, wherein the optical confinement layer has a thickness of more than 100 Å.

10. The semiconductor optoelectronic device of claim 1, wherein the substrate is formed of Si, sapphire, SiC, or GaN.

11. The semiconductor optoelectronic device of claim 10, wherein the active layer, the upper and lower waveguide layers, the upper and lower cladding layers, and the upper and lower optical confinement layers are formed of a nitride-based material.

12. The semiconductor optoelectronic device of claim 11, wherein an electron blocking layer formed of p-type AlGaN is interposed between the upper waveguide layer and the upper optical confinement layer.

13. The semiconductor optoelectronic device of claim 12, wherein the optical confinement layer is formed of $Al_xIn_yGa_{1-x-y}N$ ($0 \leq x, y \leq 1, 0 \leq x+y \leq 1$).

14. The semiconductor optoelectronic device of claim 10, wherein the upper and lower waveguide layers are formed of p-GaN and n-GaN, respectively, the upper and lower cladding layers are formed of p-AlGaN/p-GaN and n-AlGaN/n-GaN, respectively, or p-AlGaN and n-AlGaN, respectively, and the active layer is formed of AlInGaN ($Al_vIn_xGa_{1-x-v}N/Al_wIn_yGa_{1-y-w}N$, $0 \leq v, w, x, y \leq 1, 0 \leq x+y, y+w \leq 1, y \leq x, v \leq w$).

15. The semiconductor optoelectronic device of claim 14, wherein the optical confinement layer is formed of $Al_xIn_yGa_{1-x-y}N$ ($0 \leq x, y \leq 1, 0 \leq x+y \leq 1$).

16. The semiconductor optoelectronic device of claim 15, wherein the optical confinement layer is doped with Si or Mg.

17. The semiconductor optoelectronic device of claim 15, wherein the optical confinement layer has a thickness of more than 100 Å.

18. The semiconductor optoelectronic device of claim 1, wherein the active layer, the upper and lower waveguide layers, the upper and lower cladding layers, and the upper and lower optical confinement layers are formed of a nitride-based material.

19. The semiconductor optoelectronic device of claim 1, wherein the upper and lower waveguide layers are formed of p-GaN and n-GaN, respectively, the upper and lower cladding layers are formed of p-AlGaN/p-GaN and n-AlGaN/n-GaN, respectively, or p-AlGaN and n-AlGaN, respectively, and the active layer is formed of AlInGaN ($Al_vIn_xGa_{1-x-v}N/Al_wIn_yGa_{1-y-w}N$, $0 \leq v, w, x, y \leq 1, 0 \leq x+y, y+w \leq 1, y \leq x, v \leq w$).

20. The semiconductor optoelectronic device of claim 19, wherein an electron blocking layer formed of p-type AlGaN is interposed between the upper waveguide layer and the upper optical confinement layer.

21. The semiconductor optoelectronic device of claim 20, wherein the optical confinement layer is formed of $Al_xIn_yGa_{1-x-y}N$ ($0 \leq x, y \leq 1, 0 \leq x+y \leq 1$).

22. The semiconductor optoelectronic device of claim 19, wherein the optical confinement layer is formed of $Al_xIn_yGa_{1-x-y}N$ ($0 \leq x, y \leq 1, 0 \leq x+y \leq 1$).

23. The semiconductor optoelectronic device of claim 22, wherein the optical confinement layer is doped with Si or Mg.

24. The semiconductor optoelectronic device of claim 22, wherein the optical confinement layer has a thickness of more than 100 Å.

* * * * *